US012057408B2

(12) United States Patent
Kim et al.

(10) Patent No.: US 12,057,408 B2
(45) Date of Patent: Aug. 6, 2024

(54) SEMICONDUCTOR PACKAGES

(71) Applicant: Samsung Electronics Co., Ltd., Suwon-si (KR)

(72) Inventors: Chulwoo Kim, Incheon (KR); Yanggyoo Jung, Gwangmyeong-si (KR); Soohyun Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 115 days.

(21) Appl. No.: 17/171,475

(22) Filed: Feb. 9, 2021

(65) Prior Publication Data

US 2022/0013475 A1 Jan. 13, 2022

(30) Foreign Application Priority Data

Jul. 10, 2020 (KR) ........................ 10-2020-0085204

(51) Int. Cl.

| | |
|---|---|
| ***H01L 23/00*** | (2006.01) |
| ***H01L 23/16*** | (2006.01) |
| ***H01L 23/31*** | (2006.01) |
| ***H01L 23/367*** | (2006.01) |
| ***H01L 23/498*** | (2006.01) |
| ***H01L 25/065*** | (2023.01) |

(52) U.S. Cl.

CPC ............ *H01L 23/562* (2013.01); *H01L 23/16* (2013.01); *H01L 23/3185* (2013.01); *H01L 23/3675* (2013.01); *H01L 23/49838* (2013.01); *H01L 24/16* (2013.01); *H01L 25/0652* (2013.01); *H01L 2224/16227* (2013.01); *H01L 2225/06513* (2013.01); *H01L 2225/06541* (2013.01); *H01L 2225/06589* (2013.01); *H01L 2924/18161* (2013.01); *H01L 2924/3511* (2013.01)

(58) Field of Classification Search

CPC ... H01L 23/562; H01L 23/16; H01L 23/3185; H01L 23/3675; H01L 23/49838; H01L 24/16; H01L 25/0652; H01L 2224/16227; H01L 2225/06513; H01L 2225/06541; H01L 2225/06589; H01L 2924/18161; H01L 2924/3511

See application file for complete search history.

(56) References Cited

U.S. PATENT DOCUMENTS

| | | | | |
|---|---|---|---|---|
| 7,144,756 | B1 | 12/2006 | Wang et al. | |
| 8,349,658 | B2 | 1/2013 | Chi et al. | |
| 10,163,754 | B2 * | 12/2018 | Ho | H01L 23/3675 |
| 10,410,983 | B2 | 9/2019 | Kamgaing et al. | |
| 2003/0030140 | A1 * | 2/2003 | Shim | H01L 23/49833 257/E23.101 |
| 2006/0091509 | A1 * | 5/2006 | Zhao | H01L 23/552 257/E23.101 |
| 2006/0091542 | A1 | 5/2006 | Zhao et al. | |

(Continued)

*Primary Examiner* — Benjamin Tzu-Hung Liu
(74) *Attorney, Agent, or Firm* — Myers Bigel, P.A.

(57) ABSTRACT

A semiconductor package includes a substrate including a wiring, a semiconductor chip structure on the substrate, and electrically connected to the wiring, an underfill resin in a space between the substrate and the semiconductor chip structure, and a stiffener surrounding the semiconductor chip structure, on the substrate, wherein the stiffener includes a conductive frame having a cavity and an insulating filler in the cavity.

20 Claims, 14 Drawing Sheets

100a

(56) References Cited

U.S. PATENT DOCUMENTS

| | | | | |
|---|---|---|---|---|
| 2007/0145571 | A1* | 6/2007 | Lee | H01L 23/04 257/E23.101 |
| 2011/0156235 | A1* | 6/2011 | Yuan | H01L 23/49833 257/E21.511 |
| 2012/0074596 | A1* | 3/2012 | Sumita | H01L 25/0657 257/E23.116 |
| 2014/0048326 | A1* | 2/2014 | Lin | H05K 9/00 174/377 |
| 2014/0048951 | A1 | 2/2014 | Lin et al. | |
| 2017/0287799 | A1 | 10/2017 | Klein et al. | |
| 2017/0287873 | A1 | 10/2017 | Sankarasubramanian et al. | |
| 2019/0051615 | A1 | 2/2019 | Nair et al. | |
| 2019/0115269 | A1* | 4/2019 | Pan | H01L 23/04 |
| 2020/0006247 | A1* | 1/2020 | Ong | H01L 23/552 |
| 2020/0294968 | A1* | 9/2020 | Sikka | H01L 23/5226 |

* cited by examiner

SEMICONDUCTOR PACKAGES

CROSS-REFERENCE TO RELATED APPLICATION

This application claims the priority and benefit of Korean Patent Application No. 10-2020-0085204, filed on Jul. 10, 2020, with the Korean Intellectual Property Office, the entirety of which is incorporated herein by reference.

BACKGROUND

The present disclosure relates to semiconductor packages. In accordance with the trend for miniaturization and high performance in semiconductor chips, in the semiconductor packaging field, a system-in-package (SIP) technology in which a plurality of semiconductor chips are embedded in a single package is being developed. Differences in a coefficient of thermal expansion between different materials in a semiconductor package, however, may result in warpage of the semiconductor package.

SUMMARY

An aspect of the present inventive concept is to provide a semiconductor package having improved warpage at room temperature and high temperature.

According to an aspect of the present inventive concept, a semiconductor package includes: a substrate including a wiring; a semiconductor chip structure on the substrate, and electrically connected to the wiring; an underfill resin in a space between the substrate and the semiconductor chip structure; and a stiffener surrounding a side surface of the semiconductor chip structure, on the substrate, wherein the stiffener includes a conductive frame having a cavity and an insulating filler in the cavity.

According to an aspect of the present inventive concept, a semiconductor package includes: a substrate including a first wiring; an interposer substrate on the substrate, and including a second wiring electrically connected to the first wiring; first and second semiconductor chip structures on the interposer substrate, and electrically connected to each other by the second wiring; and a stiffener surrounding the interposer substrate and the first and second semiconductor chip structures, on the substrate, wherein the stiffener includes a conductive frame having a cavity and an insulating filler in the cavity, the conductive frame comprises a metal material, and the insulating filler comprises an organic material.

According to an aspect of the present inventive concept, a semiconductor package includes: a substrate; a semiconductor chip structure on the substrate; a conductive frame surrounding the semiconductor chip structure on the substrate; and an insulating filler in an inside of the conductive frame, wherein the insulating filler comprises a material having a glass transition temperature (Tg).

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1:
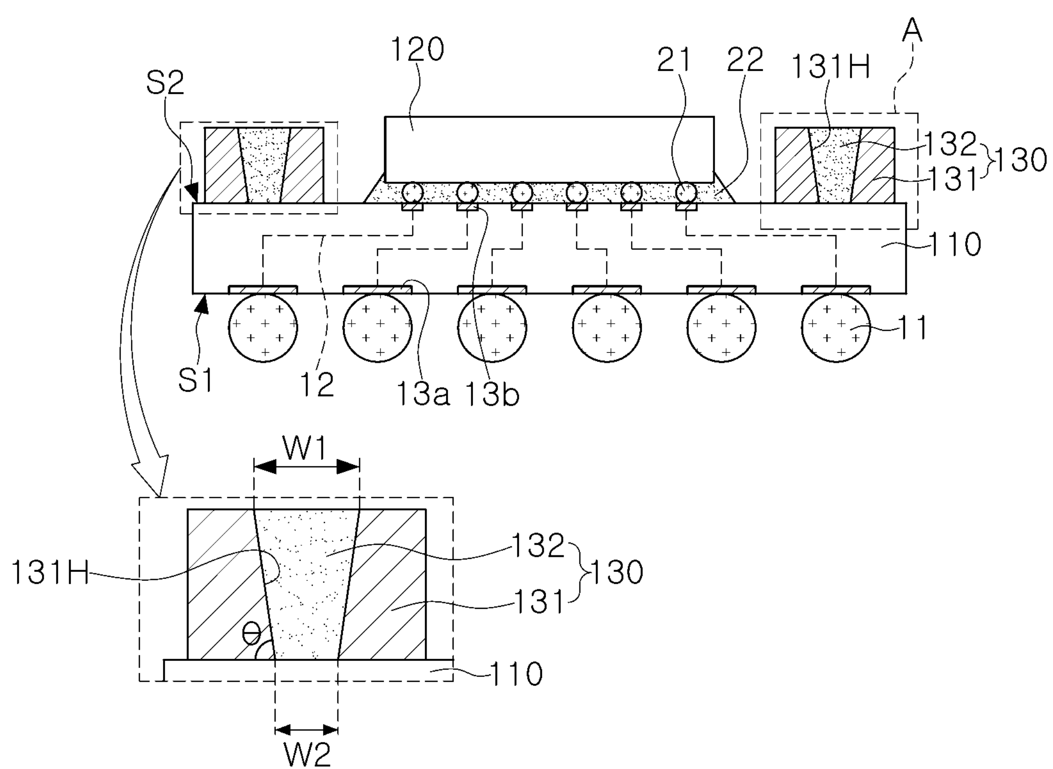
FIG. 1 is a cross-sectional view illustrating a semiconductor package according to an example embodiment of the present inventive concept.
Figure 2:
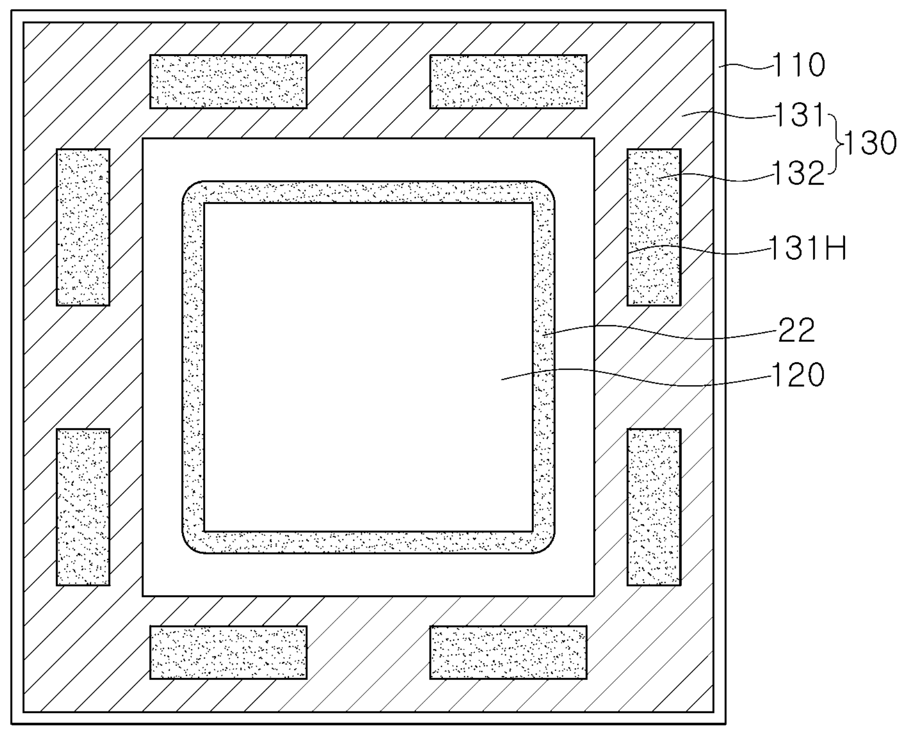
FIG. 2 is a plan view illustrating an upper surface of the semiconductor package of FIG. 1.

FIG. 1 is a cross-sectional view illustrating a semiconductor package 100*a* according to an example embodiment of the present inventive concept, while FIG. 2 is a plan view illustrating an upper surface of the semiconductor package 100*a* of FIG. 1.

Referring to FIGS. 1 and 2, the semiconductor package 100*a* may include a substrate 110, a semiconductor chip structure 120, and a stiffener 130. In addition, an underfill resin 22 between the substrate 110 and the semiconductor chip structure 120 may be further included.

The substrate 110 is a support substrate on which the semiconductor chip structure 120 and the stiffener 130 are mounted. The substrate 110 may include pads 13*a* and 13*b* disposed on a lower surface S1 and an upper surface S2, respectively, of the substrate 110. Moreover, the substrate 110 may include a wiring 12 electrically connecting the pads 13*a* and 13*b* to each other. The substrate 110 may be a substrate for a semiconductor package including a printed circuit board (PCB), a ceramic substrate, a glass substrate, a tape wiring board, or the like. The substrate 110 may be a substrate for a package having a large area. For example, the substrate 110 may have a flat shape such as a square or a rectangle, and a minimum (i.e., narrowest) width of the substrate 110 may be 40 millimeters (mm) or more.

A body of the substrate 110 may include different materials depending on the type of the substrate 110. For example, when the substrate 110 is a PCB, the body of the substrate 110 may be a copper-clad laminate or may have a form in which wiring layers are additionally stacked on one or both (i.e., opposite) sides of a copper-clad laminate. A lower protective layer and an upper protective layer to which a solder resist is applied may be formed on a lower surface and an upper surface of the body, respectively.

The pads 13*a* and 13*b* may include at least one metal of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), or an alloy including two or more metals thereof. The pad 13*b* disposed on the upper surface S2 of the substrate 110 may correspond to (e.g., be coupled to) a connection pad of the semiconductor chip structure 120 and may be smaller in size than the pad 13*a* disposed on the lower surface S1 of the substrate 110.

The wiring 12 may form an electrical path connecting the lower surface S1 and the upper surface S2 of the substrate 110. The wiring 12 may include a single wiring layer or multiple wiring layers formed in the substrate 110 and vias connecting the same. The wiring 12 may include at least one of Cu, Al, Ni, Ag, Au, Pt, Sn, Pb, Ti, Cr, Pd, In, Zn, and C, or an alloy containing two or more metals thereof.

An external connection bump 11 may be disposed on the lower surface S1 of the substrate 110 and may be referred to as a "first connection bump." The first connection bump 11 may have a flip-chip connection structure having a grid array such as, for example, a solder ball, a conductive bump or a pin grid array, a ball grid array, and a land grid array. The first connection bump 11 may be electrically connected to the pad 13*a* of the lower surface S1 of the substrate 110 and may be electrically connected to external devices such as a module board or a system board.

The semiconductor chip structure 120 may be disposed on the substrate 110, and may be electrically connected to the wiring 12 of the substrate 110 through a second connection bump 21. The semiconductor chip structure 120 may be an integrated circuit (IC) chip in which a plurality of ICs are formed on a wafer. The semiconductor chip structure 120 may also include, for example, a logic chip such as a central processing unit (CPU), a graphics processing unit (GPU), a field programmable gate array (FPGA), a digital signal processor, an encryption processor, a microprocessor, a microcontroller, an analog-digital converter, or an application-specific IC (ASIC), or a memory chip such as a volatile memory (e.g., DRAM), a non-volatile memory (e.g., ROM), or a flash memory. The semiconductor chip structure 120 may be a large-sized chip mounted on the substrate 110 having a large area. For example, a minimum width of the semiconductor chip structure 120 may be 20 mm or more. The semiconductor package 100*a* may further include a first underfill resin 22 in (e.g., filling) a space between the substrate 110 and the semiconductor chip structure 120 and on (e.g., surrounding) side surfaces of the second connection bump 21. The first underfill resin 22 may be made of, for example, an epoxy resin.

The stiffener 130 may be disposed on the substrate 110 to control warpage of the package. The stiffener 130 may be disposed on the substrate 110 to surround side surfaces of the semiconductor chip structure 120. The stiffener 130 may include a conductive frame 131 having a cavity 131H therein that is spaced apart from a space accommodating the semiconductor chip structure 120. Moreover, the stiffener 130 may include an insulating filler 132 in (e.g., filling) the cavity 131H. An upper surface of the stiffener 130 may be positioned at a level substantially the same as (i.e., substantially coplanar with) or lower than the upper surface of the semiconductor chip structure 120.

At least a portion of the insulating filler 132 may be free of having the conductive frame 131 thereon. For example, the conductive frame 131 may not contact at least a portion of an upper surface of the insulating filler 132. Rather, at least a portion of the upper surface of the insulating filler 132 may be coplanar with an upper surface of the conductive frame 131.

The conductive frame 131 may include a metal material such as, for example, Al, Ag, Sn, Au, Ni, Pb, Ti, or an alloy thereof. A cavity 131H may have various shapes as a space separated from the through-hole in which the semiconductor chip structure 120 is accommodated. For example, as illustrated in FIG. 2, the cavity 131H may have a bar (e.g., rectangular) shape extending a predetermined length in a direction parallel to the upper surface S2 of the substrate 110. The cavity 131H may have various planar shapes in order to adjust an amount (e.g., a volume, or the like) of the insulating filler 132. In addition, the cavity 131H may have a vertical cross-sectional shape penetrating from the upper surface of the conductive frame 131 to the lower surface of the conductive frame 131. For example, as shown in FIG. 1, the cavity 131H may penetrate through the conductive frame 131 and may have a tapered shape that increases in width as the distance from the substrate 110 increases.

The cavity 131H of the stiffener 130 may have a ratio of an upper width W1 and a lower width W2 of about 3:1 to about 1:3. An inner wall of the cavity 131H may have a predetermined inclination with respect to the upper and lower surfaces of the stiffener 130. The inner wall of the cavity 131H may have a size of an acute angle between the lower surface of the stiffener 130 or the upper surface S2 of the substrate 110 from about 45° to about 90°. For example, the cavity 131H of the stiffener 130 illustrated in FIG. 1 may have a ratio of the upper width W1 and the lower width W2 of about 2:1 to about 3:1. The inner wall of the cavity 131H may have an angle θ between about 45° and about 90° with the upper surface S2 of the substrate 110.

Modified examples of the stiffener 130 will be described with reference to FIGS. 3A to 3C, respectively. Each of FIGS. 3A to 3C is a partially enlarged cross-sectional view illustrating a modified example of the portion indicated by "A" in FIG. 1.

Figure 3A:
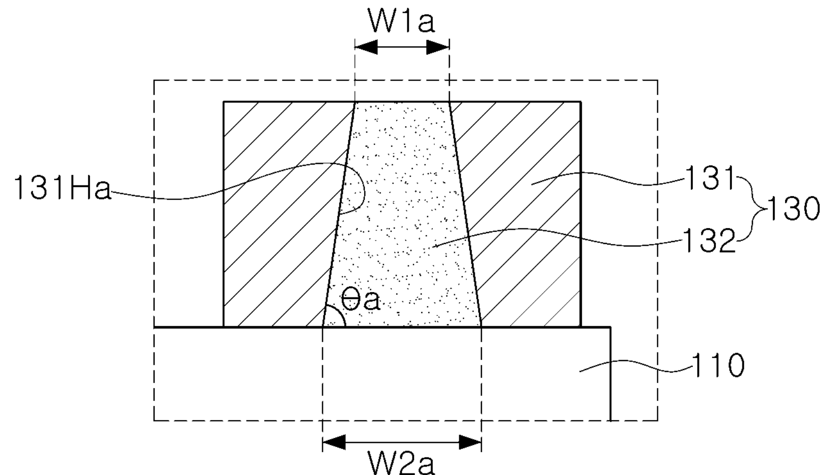
FIGS. 3A to 3C are cross-sectional views illustrating modified examples of some components of the semiconductor package of FIG. 1.

In a modified example, referring to FIG. 3A, the cavity in FIG. 1 ("131H" in FIG. 1) may be replaced with a cavity 131Ha as shown in FIG. 3A. For example, the cavity 131Ha may penetrate through the conductive frame 131 and may have a tapered shape whose width becomes narrower as the distance from the substrate 110 increases. The conductive frame 131 may be on (e.g., cover) a side surface of the insulating filler 132 that is in (e.g., that fills) the cavity 131Ha. For example, a ratio of an upper width W1*a* and a lower width W2*a* of the cavity 131Ha may be about 1:2 to about 1:3. The inner wall of the cavity 131Ha may have an angle θa between about 45° and about 90° with the upper surface of the substrate 110.

Figure 3B:
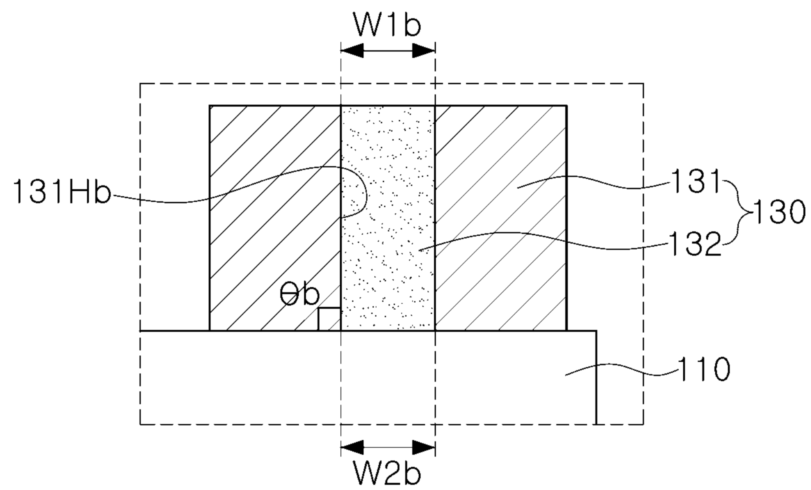

In a modified example, referring to FIG. 3B, the cavity in FIG. 1 ("131H" in FIG. 1) may be replaced with a cavity 131Hb as shown in FIG. 3B. For example, the cavity 131Hb may penetrate through the conductive frame 131 and may have a non-tapered (e.g., pipe) shape having substantially the same width. The conductive frame 131 may be on (e.g., cover) a side surface of the insulating filler 132 that is in (e.g., that fills) the cavity 131Hb. For example, the cavity 131Hb may have a ratio of the upper width W1*b* and the lower width W2*b* of about 1:1. The inner wall of the cavity 131Hb may have an angle θb of about 90° with the upper surface of the substrate 110.

Figure 3C:
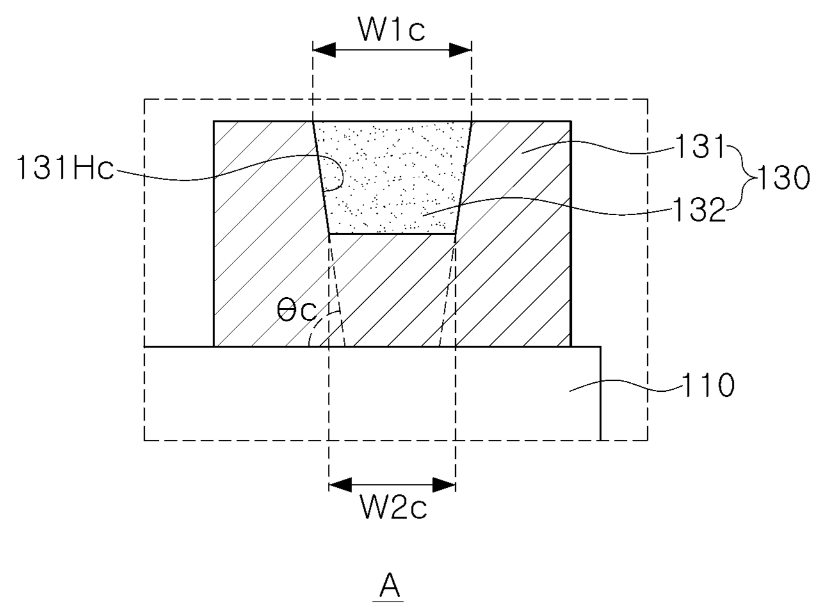

In a modified example, referring to FIG. 3C, the cavity in FIG. 1 ("131H" in FIG. 1) may be replaced with a cavity 131Hc as shown in FIG. 3C. For example, the cavity 131Hc may have a concave recessed shape from an upper surface of the conductive frame 131 toward an inside of the conductive frame 131. The conductive frame 131 may be on (e.g., cover) side and bottom surfaces of the insulating filler 132 that is in (e.g., that fills) the cavity 131Hc. For example, the cavity 131Hc may have a ratio of the upper width W1*c* and the lower width W2*c* of about 2:1 to about 3:1. The inner wall of the cavity 131Hc may have an angle θc between about 45° to about 90° with the upper surface of the substrate 110 or the bottom surface of the cavity 131Hc.

The insulating filler 132 may include an organic material such as, for example, a single polymer material or a plurality of polymer materials having a Tg, or may include an additive for adjusting the Tg. The Tg may be 200° C. or lower. The insulating filler 132 may include the same type of material (e.g., the same organic material) as the first underfill resin 22. In this case, there is an advantage in that the insulating filler 132 can be formed through the same process as the first underfill resin 22. Moreover, the first underfill resin 22 may be spaced apart from the stiffener 130 (and thus the insulating filler 132).

When the insulating filler 132 has a Tg and is inside (e.g., filled inside) the conductive frame 131, warpage caused by expansion of the conductive frame 131 may be reduced using a low modulus of elasticity of an organic material (of the insulating filler 132) at a high temperature above the Tg, and a warpage control effect of the conductive frame 131 may be further increased using a coefficient of thermal expansion (CTE) of the organic material at a room temperature. Therefore, the stiffener 130 including the conductive frame 131 and the insulating filler 132 may occupy a large area on the substrate 110. The area of a contact surface of the stiffener 130 and the substrate 110 may be about 30% or more of the surface area of the upper surface S2 of the substrate 110. For example, when the widths of the lower surface and the upper surface of the stiffener 130 are substantially the same, the area of the upper surface of the stiffener may be about 30% or more of the area of the upper surface S2 of the substrate 110. The amount of the insulating filler 132 contained in the stiffener 130 may be adjusted according to the size and structure of the package. For example, a volume ratio of the conductive frame 131 and the insulating filler 132 in the stiffener 130 may be about 2:8 to about 8:2.

Figure 4:
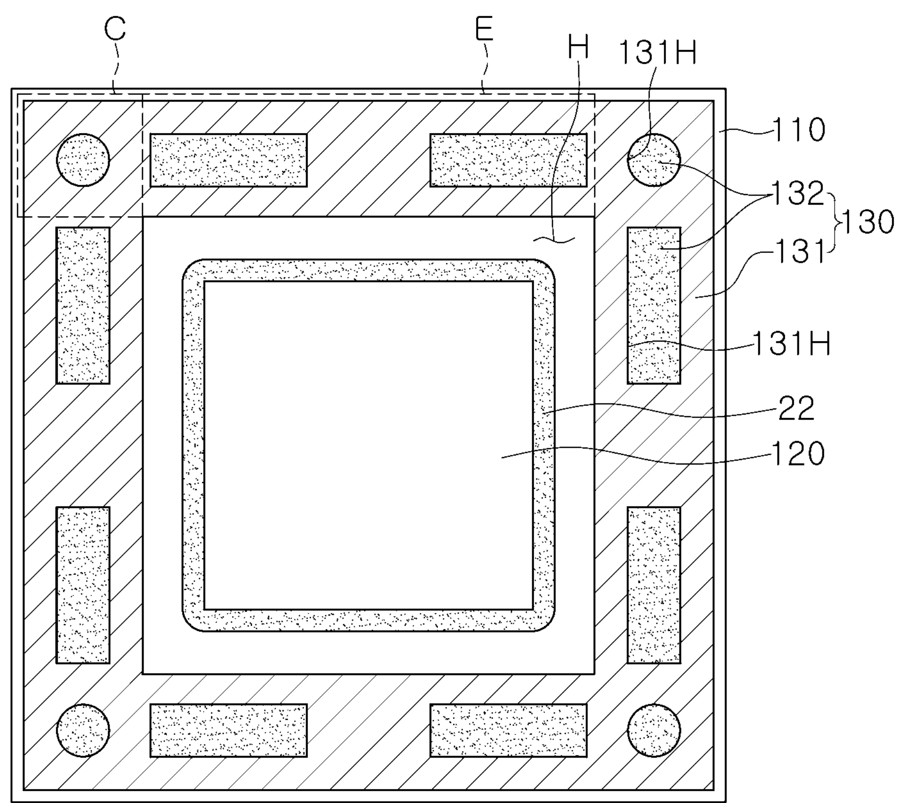
FIG. 4 is a plan view illustrating a semiconductor package according to an example embodiment of the present inventive concept.
Figure 5:
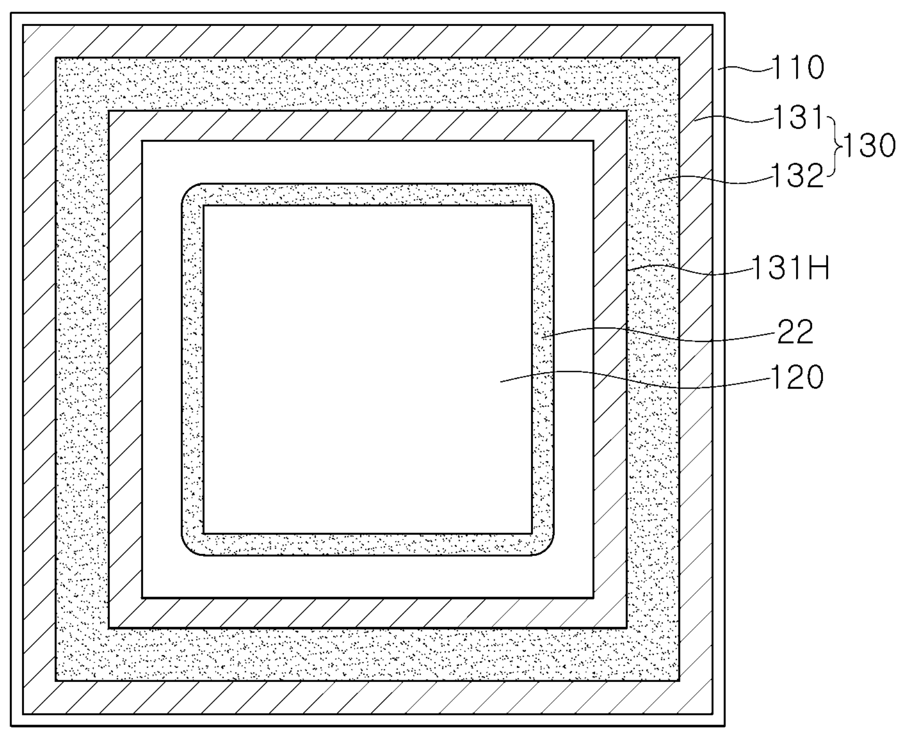
FIG. 5 is a plan view illustrating a semiconductor package according to an example embodiment of the present inventive concept.

FIG. 4 is a plan view illustrating a semiconductor package 100*b* according to an example embodiment of the present inventive concept, and FIG. 5 is a plan view illustrating a semiconductor package 100*c* according to an example embodiment of the present inventive concept.

Referring to FIG. 4, in the semiconductor package 100*b*, the insulating filler 132 may be evenly distributed within the conductive frame 131 in order to suppress expansion of the conductive frame 131 at a high temperature. For example, the conductive frame 131 may have a plurality of edge portions E constituting an inner wall of a through-hole H corresponding to the corners of the semiconductor chip structure 120, respectively, and a plurality of corner portions C connecting the plurality of edge portions E, and the insulating filler 132 may be filled at least partially in a region of the plurality of edge portions E and at least partially in a region of the corner portions C.

Referring to FIG. 5, the insulating filler 132 may have a ring shape continuously surrounding the semiconductor chip structure 120 in the conductive frame 131, in the semiconductor package 100*c*.

Figure 6:
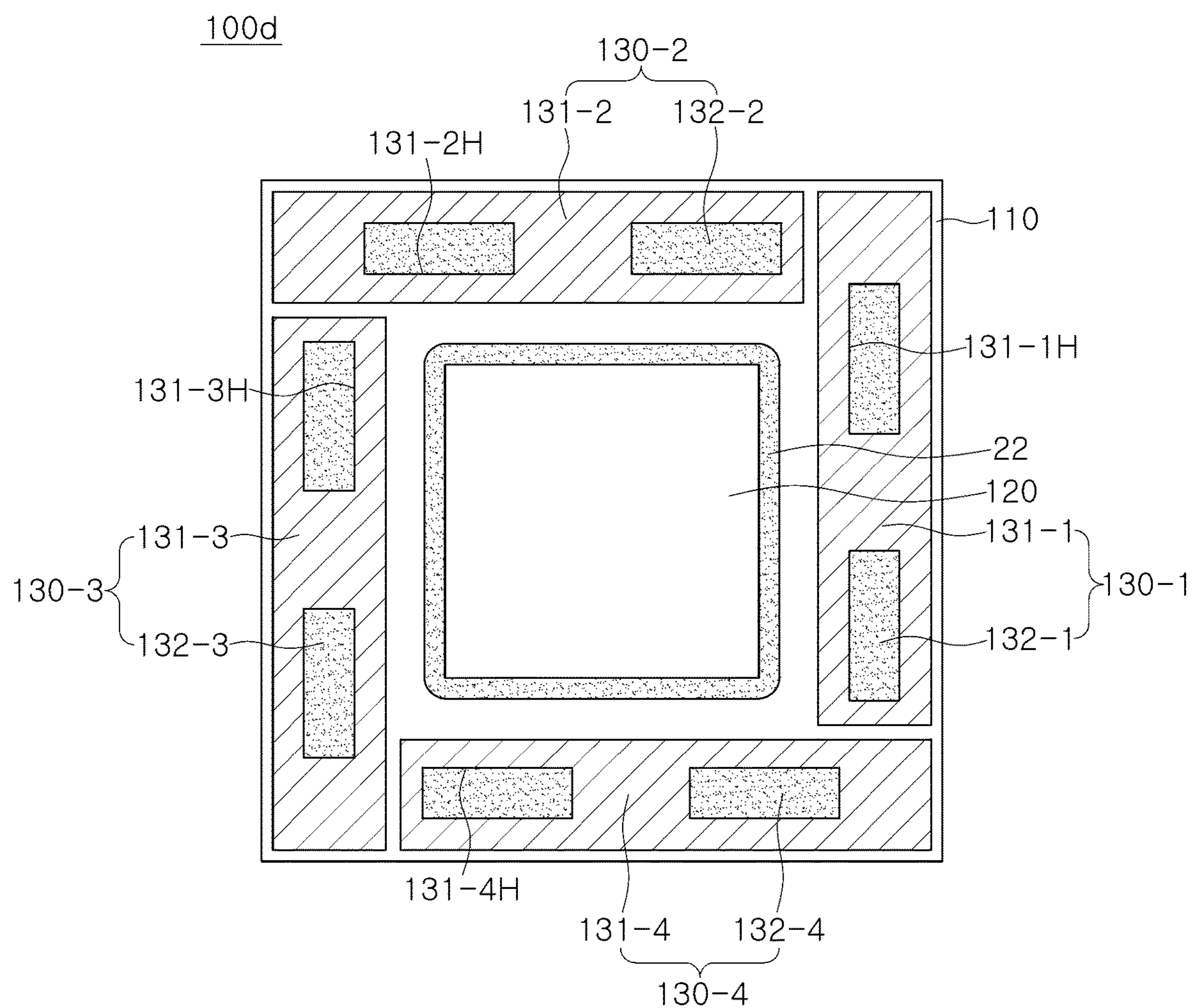
FIG. 6 is a cross-sectional view illustrating a semiconductor package according to an example embodiment of the present inventive concept.

FIG. 6 is a cross-sectional view illustrating a semiconductor package according to an example embodiment of the present inventive concept.

Referring to FIG. 6, a plurality of stiffeners 130 may include a plurality of stiffeners 130-1, 130-2, 130-3, and 130-4 spaced apart from each other in a direction parallel to the upper surface S2 of the substrate 110 and surrounding the semiconductor chip structure 120. The plurality of stiffeners 130-1, 130-2, 130-3, and 130-4 may include a plurality of conductive frames 131-1, 131-2, 131-3, and 131-4 and insulating fillers 132-1, 132-2, 132-3, and 132-4, respectively.

Figure 7:
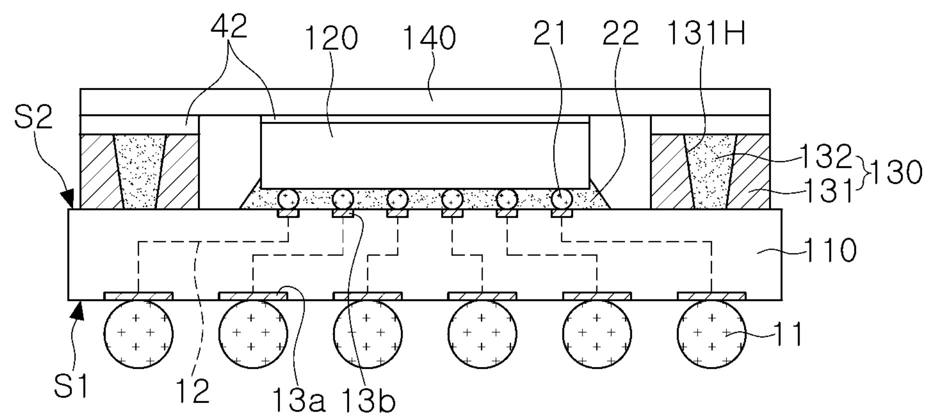
FIG. 7 is a cross-sectional view illustrating a semiconductor package according to an example embodiment of the present inventive concept.

FIG. 7 is a cross-sectional view illustrating a semiconductor package 100*d* according to an example embodiment of the present inventive concept.

Referring to FIG. 7, the semiconductor package 100*d* may further include a heat sink 140 disposed on the semiconductor chip structure 120 and a stiffener 130. The heat sink 140 may be attached to upper surfaces of the stiffener 130 and the semiconductor chip structure 120 by an adhesive member 42.

The heat sink 140 may be in the shape of a plate covering the upper surfaces of each of the semiconductor chip structure 120 and the stiffener 130, and may include metal such as Au, Ag, or Cu, or a conductive material such as graphite or graphene. The adhesive member 42 may be a thermally conductive adhesive tape, a thermally conductive grease, a thermally conductive adhesive, or the like.

Figure 8:
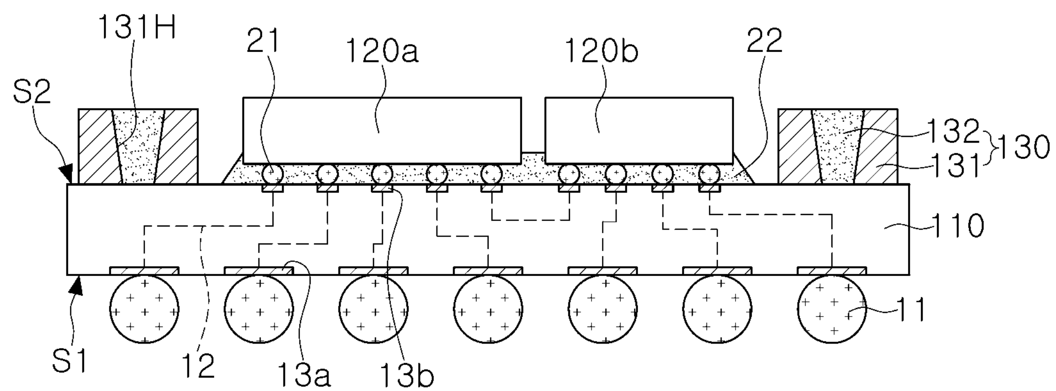
FIG. 8 is a cross-sectional view illustrating a semiconductor package according to an example embodiment of the present inventive concept.

FIG. 8 is a cross-sectional view illustrating a semiconductor package 100*e* according to an example embodiment of the present inventive concept.

Referring to FIG. 8, the semiconductor package 100*e* may include a first semiconductor chip structure 120*a* and a second semiconductor chip structure 120*b* spaced apart from each other in a horizontal direction on the upper surface S2 of the substrate 110. The first semiconductor chip structure 120*a* and the second semiconductor chip structure 120*b* may be electrically connected to each other through a wiring 12.

The first semiconductor chip structure 120*a* and the second semiconductor chip structure 120*b* may be electrically connected to the wiring 12 of the substrate 110. The first semiconductor chip structure 120*a* and the second semiconductor chip structure 120*b* may be electrically connected to the wiring 12 of the substrate 110 by a second connection bump 21. The first semiconductor chip structure 120*a* and the second semiconductor chip structure 120*b* may include different types of semiconductor chips. For example, the first semiconductor chip structure 120*a* may include an application processor chip such as a central processor (for example, a CPU), a graphics processor (for example, a GPU), a digital signal processor, a cryptographic processor, a microprocessor, a microcontroller, or the like, and a logic chip such as an analog-to-digital converter (ADC), an ASIC, or the like, and the second semiconductor chip structure 120*b* may include a memory chip such as a DRAM, a SRAM, a flash, a PRAM, a ReRAM, a FeRAM, a MRAM, a high bandwidth memory (HBM), a hybrid memory cubic (HMC), or the like.

Figure 9:
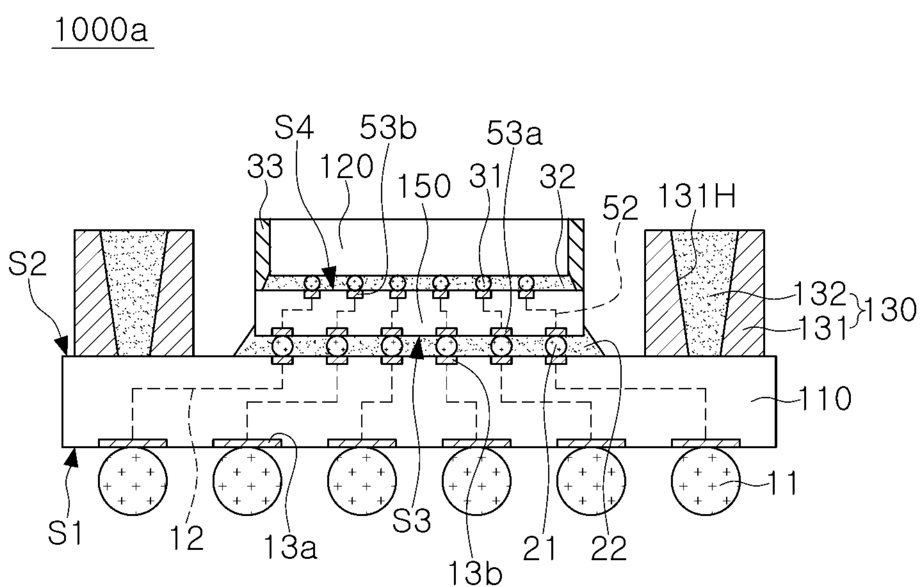
FIG. 9 is a cross-sectional view illustrating a semiconductor package according to an example embodiment of the present inventive concept.

FIG. 9 is a cross-sectional view illustrating a semiconductor package 1000*a* according to an example embodiment of the present inventive concept.

Referring to FIG. 9, the semiconductor package 1000*a* may further include an interposer substrate 150 electrically connecting the semiconductor chip structure 120 and the substrate 110. For example, the semiconductor package 1000*a* may include a substrate 110 including a first wiring 12, an interposer substrate 150 disposed on the substrate 110, and electrically connected to the first wiring 12, a semiconductor chip structure 120 disposed on the interposer substrate 150, and electrically connected to a second wiring 52, and a stiffener 130 including a conductive frame 131 disposed around the interposer substrate 150 and the semiconductor chip structure 120, and having a cavity 131H and an insulating filler 132 in (e.g., filling) the cavity 131H. As illustrated in FIG. 6, a plurality of stiffeners 130 may be spaced apart from each other in a direction, parallel to the upper surface S2 of the substrate 110, and may surround the interposer substrate 150 and the semiconductor chip structure 120.

The interposer substrate 150 may be a substrate for a semiconductor package such as a PCB, a ceramic substrate, or a tape wiring board. The interposer substrate 150 may include a plurality of terminals 53*a* and 53*b* and a second wiring 52 electrically connecting the plurality of terminals 53*a* and 53*b* on upper and lower surfaces S4 and S3. For example, the second wiring 52 may be formed of a circuit layer formed on one surface or both surfaces of the interposer substrate 150 and a through silicon via (TSV) penetrating through the interposer substrate 150. The terminal 53*b* disposed on the upper surface S4 of the interposer substrate 150 corresponding to the connection pad of the semiconductor chip structure 120 may be smaller in size than the terminal 53*a* disposed on the lower surface S3 of the interposer substrate 150. The semiconductor chip structure 120 may be electrically connected to the second wiring 52 through a third connection bump 31. Moreover, the second wiring 52 may be electrically connected to the first wiring 12 that is in the substrate 110.

In addition, an encapsulant 33 for sealing at least a part of the semiconductor chip structure 120 may be disposed on the interposer substrate 150. The encapsulant 33 may include, for example, a thermosetting resin such as an epoxy resin, a thermoplastic resin such as polyimide, or a prepreg including an inorganic filler or/and glass fibers, an Ajinomoto Build-up Film (ABF), a FR-4, a Bismaleimide Triazine (BT), or an Epoxy Molding Compound (EMC).

The semiconductor package 1000*a* may further include a second underfill resin 32 surrounding the third connection bump 31 between the semiconductor chip structure 120 and the interposer substrate 150. The second underfill resin 32 may include the same material as the first underfill resin 22. The second underfill resin 32 may be a part of the encapsulant 33 formed in a molded under-fill (MUF) method.

Figure 10:
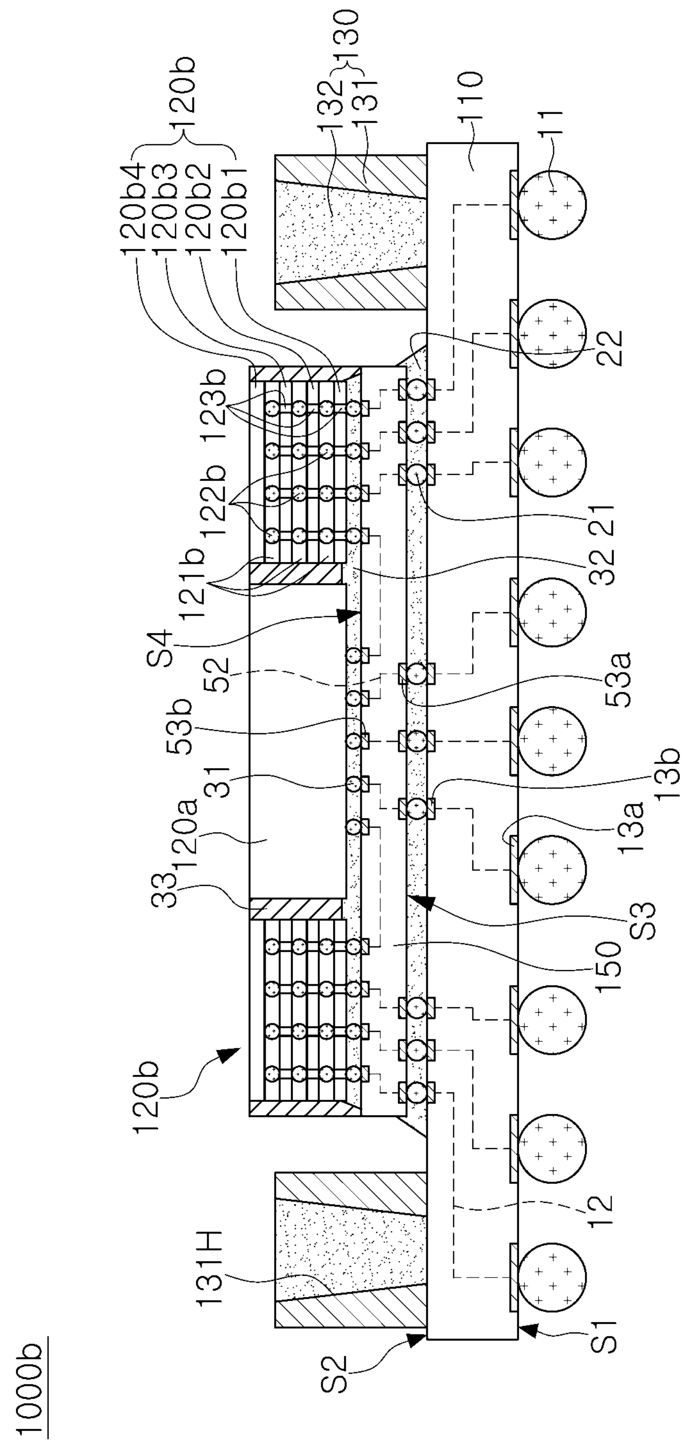
FIG. 10 is a cross-sectional view illustrating a semiconductor package according to an example embodiment of the present inventive concept.

FIG. 10 is a cross-sectional view illustrating a semiconductor package 1000*b* according to an example embodiment of the present inventive concept.

Referring to FIG. 10, the semiconductor package 1000*b* may include a first semiconductor chip structure 120*a* and a second semiconductor chip structure 120*b* spaced apart from each other in a direction, parallel to an upper surface S4 of the interposer substrate 150, compared to the semiconductor package 1000*a* of FIG. 9. The second semiconductor chip structure 120*b* may include a plurality of semiconductor chips 120*b*1, 120*b*2, 120*b*3, and 120*b*4 stacked in a direction perpendicular to the upper surface S4 of the interposer substrate 150. An interconnection bump 122*b* and an insulating layer 121*b* surrounding the interconnection bump 122*b* and adhering the semiconductor chips 120*b*1, 120*b*2, 120*b*3, and 120*b*4, which are disposed vertically, may be disposed between the stacked semiconductor chips 120*b*1, 120*b*2, 120*b*3, and 120*b*4. The stacked semiconductor chips 120*b*1, 120*b*2, 120*b*3, and 120*b*4 may be electrically connected to each other by vias 123*b* (e.g., through-vias) penetrating through some of the semiconductor chips 120*b*1, 120*b*2, and 120*b*3. For example, the second semiconductor chip structure 120*b* may be a high-performance memory structure such as HBM or HMC. In some embodiments, the second wiring 52 may electrically connect the first semiconductor chip structure 120*a* to the second semiconductor chip structure 120*b*.

Figure 11:
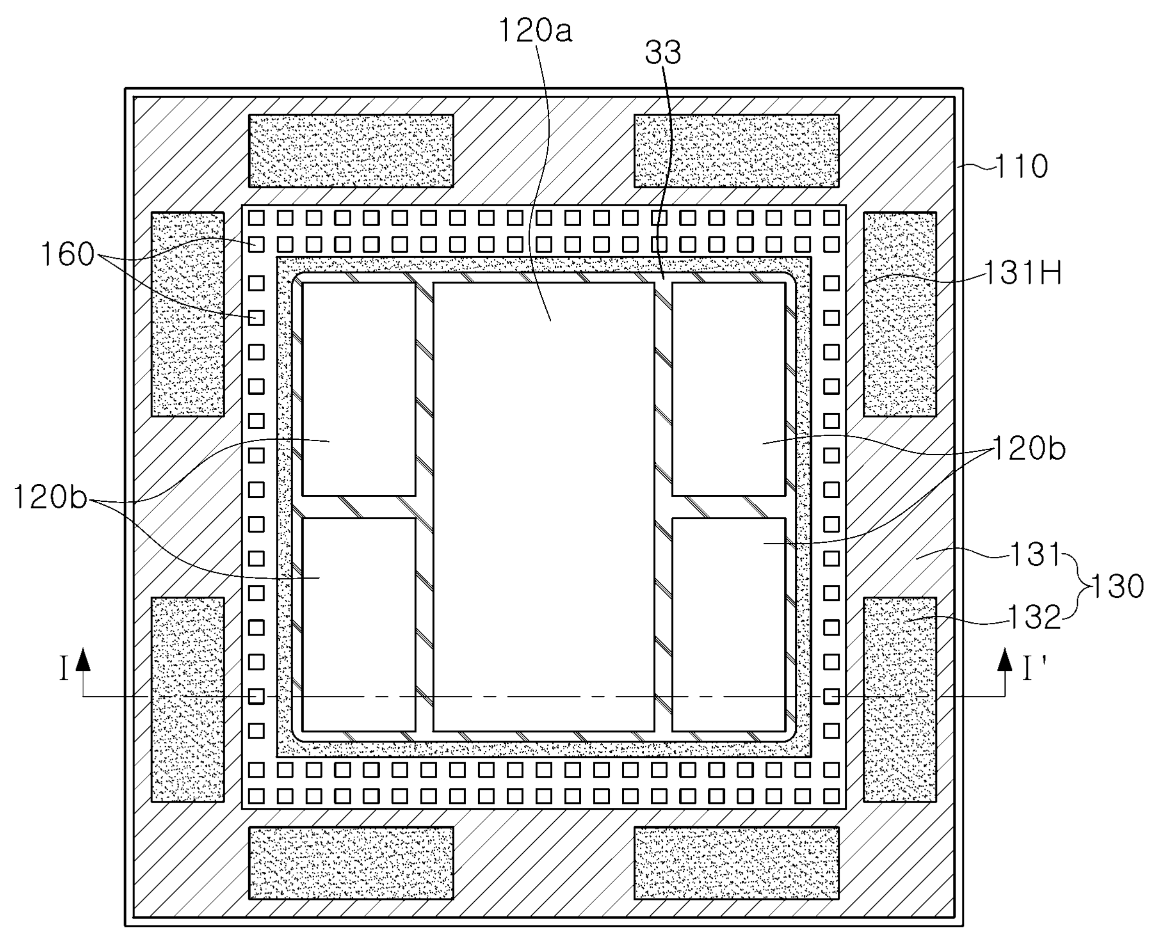
FIG. 11 is a plan view illustrating a semiconductor package according to an example embodiment of the present inventive concept.
Figure 12:
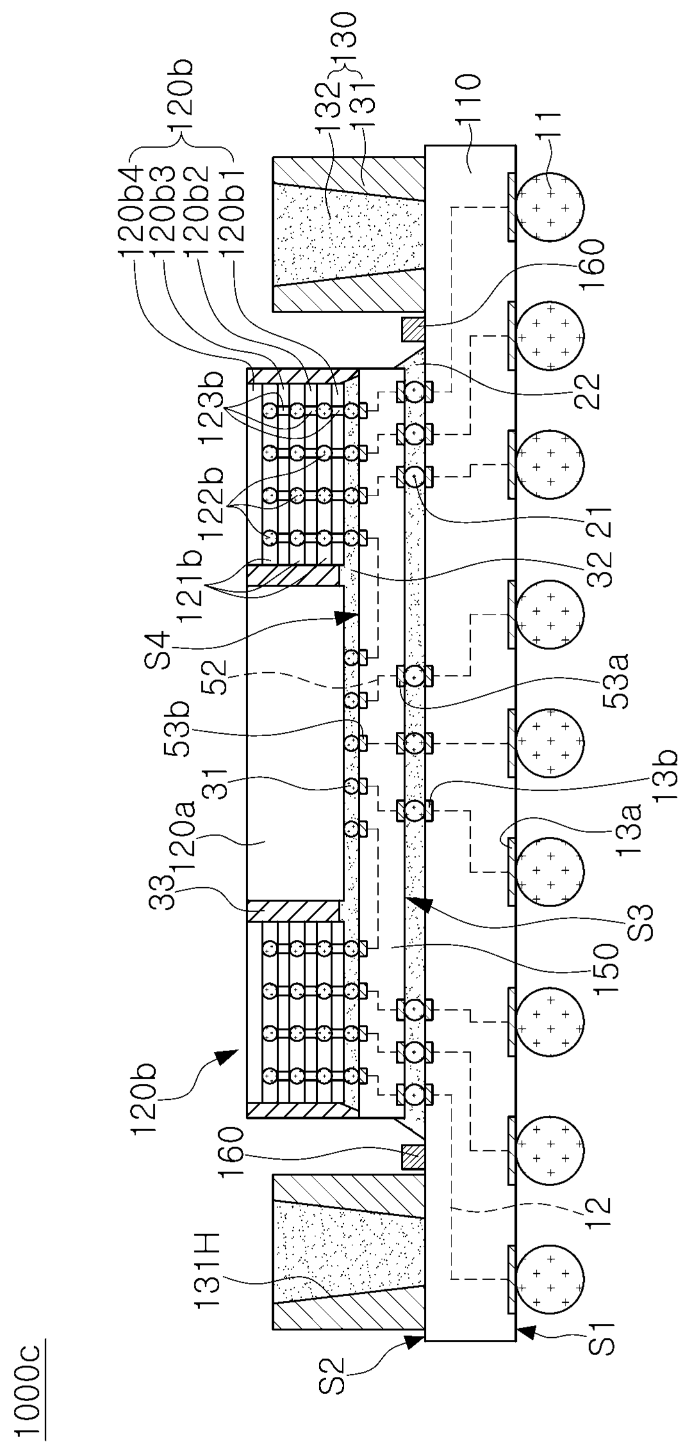
FIG. 12 is a cross-sectional view illustrating a plane taken along line I-I' in the package of FIG. 11.

FIG. 11 is a cross-sectional view illustrating a semiconductor package 1000*c* according to an example embodiment of the present inventive concept, and FIG. 12 is a cross-sectional view illustrating an I-I' cross-sectional view of the package of FIG. 11.

Referring to FIGS. 11 and 12, the semiconductor package 1000*c* may be mounted on the substrate 110, and may further include a plurality of passive components 160 disposed between the interposer substrate 150 and the stiffener 130. The plurality of passive components 160 may be electrically connected to the first and second semiconductor chip structures 120*a* and 120*b* through the substrate 110 and the interposer substrate 150 (e.g., through the wirings 12 and 52, respectively, therein). The plurality of passive components 160 may include different types and different sizes of passive devices. For example, a passive component 160 may be a capacitor such as a multilayer ceramic capacitor (MLCC), an inductor such as a power inductor, a bead, or the like.

Figure 13:
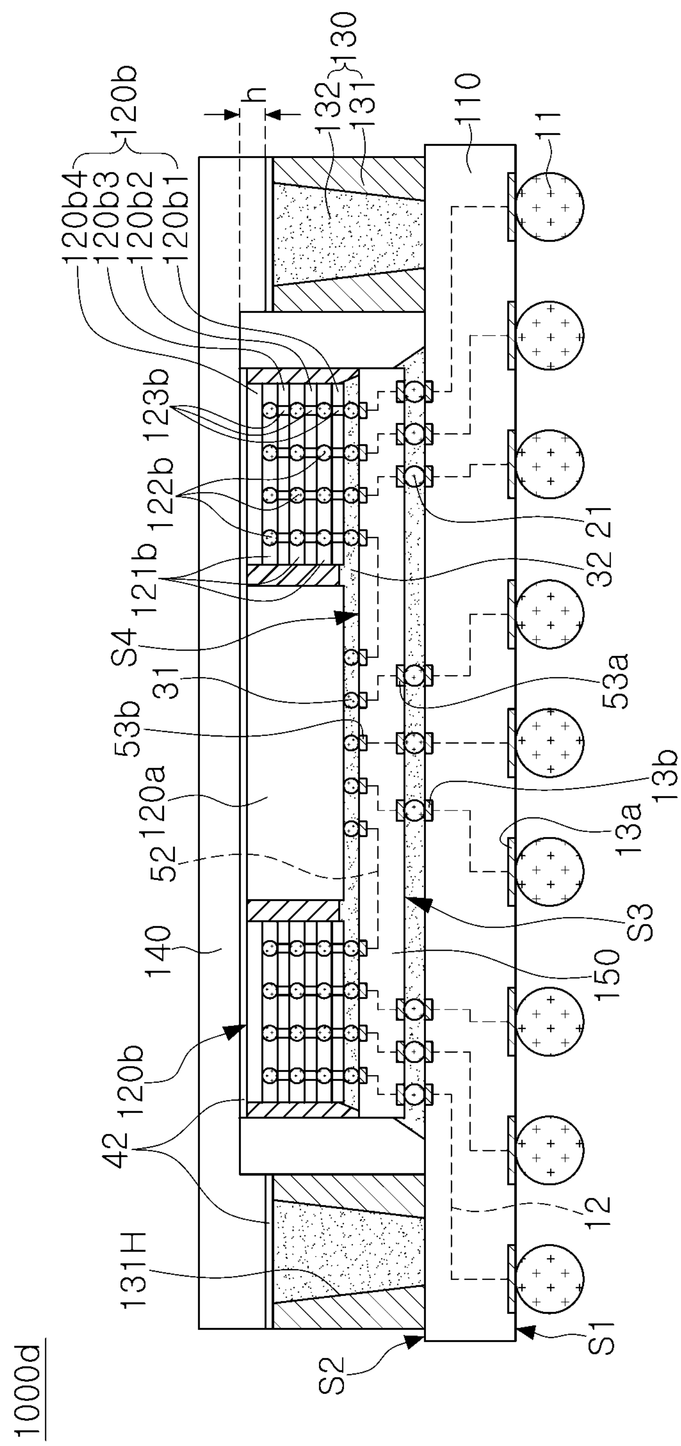
FIG. 13 is a cross-sectional view illustrating a semiconductor package according to an example embodiment of the present inventive concept.

FIG. 13 is a cross-sectional view illustrating a semiconductor package 1000*d* according to an embodiment of the present inventive concept.

Referring to FIG. 13, the semiconductor package 1000*d* may further include a heat sink 140 disposed on the first and second semiconductor chip structures 120*a* and 120*b* and the stiffener 130. The heat sink 140 may be attached to the stiffener 130 by an adhesive member 42. Features of the heat sink 140 and the adhesive member 42 may be substantially the same as those described with respect to FIG. 7. In an example embodiment, a portion of the heat sink 140 corresponding to (i.e., vertically overlapping) the stiffener 130 may protrude toward the stiffener 130. Therefore, the heat sink 140 may have a step h between a first lower surface covering the semiconductor chip structures 120*a* and 120*b* and a second lower surface covering the stiffener 130.

Figure 14:
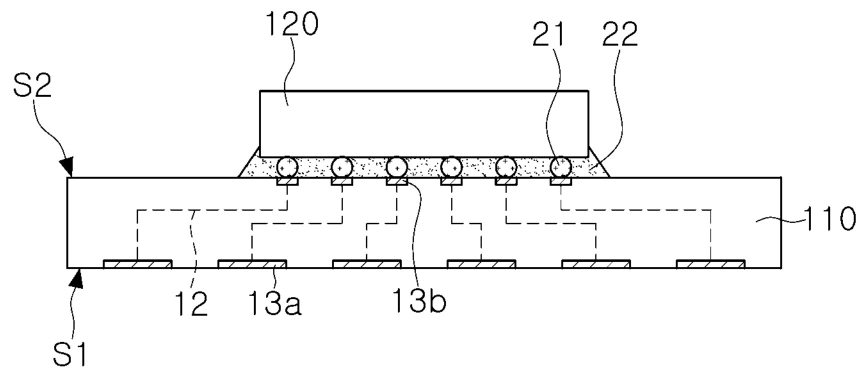
FIGS. 14 to 16 are cross-sectional views schematically illustrating a manufacturing process of the semiconductor package of FIG. 1.
Figure 15:
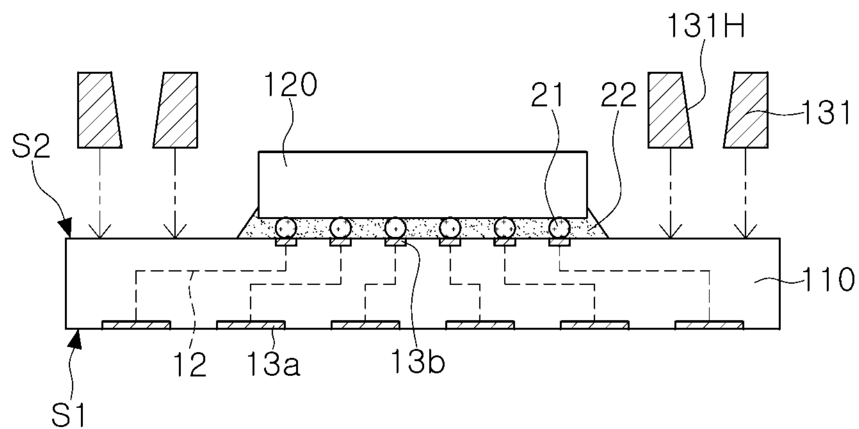
Figure 16:
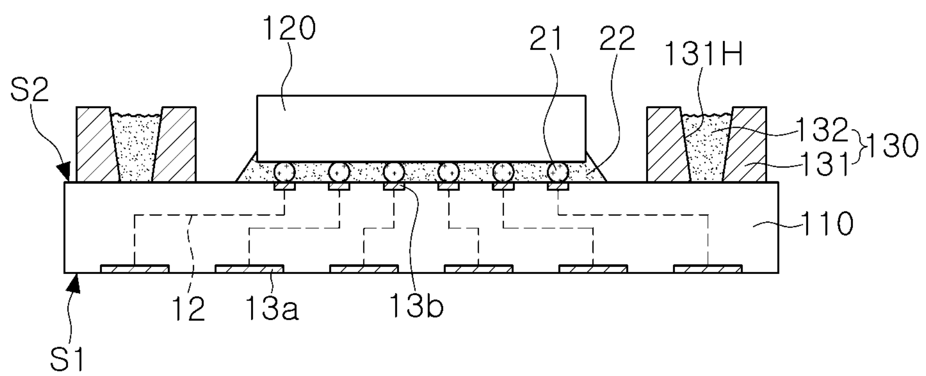

FIGS. 14 to 16 are cross-sectional views schematically illustrating a manufacturing process of the semiconductor package 100*a* of FIG. 1.

Referring to FIG. 14, the semiconductor chip structure 120 may be mounted on a substrate 110 in a flip-chip manner using a connection bump 21. The connection bump 21 may include a low melting point metal, for example, Sn or an alloy containing Sn (e.g., Sn—Ag—Cu). Thereafter, an underfill resin 22 may be formed between the substrate 110 and the semiconductor chip structure 120. The underfill resin 22 may be formed by a process such as Capillary, No-flow underfill (NCP), Non-conductive film (NCF), or the like.

Referring to FIG. 15, a conductive frame 131 having a cavity 131H formed on a substrate 110 may be attached. The conductive frame 131 may be attached on the substrate 110 by an adhesive member. The type of the adhesive member is not particularly limited, and for example, an adhesive material including epoxy or polyimide may be used. The conductive frame 131 may be disposed to surround the semiconductor chip structure 120. The cavity 131H may be formed by etching the conductive frame 131 including a metal material by a physical or chemical method. The cavity 131H may have a shape in which an inner wall thereof is tapered. In some embodiments, unlike what is shown in FIGS. 14 and 15, the conductive frame 131 may be disposed first before mounting the semiconductor chip structure 120.

Referring to FIG. 16, the stiffener 130 may be completed by forming (e.g., filling) an insulating filler 132 including an organic material in the cavity 131H. The insulating filler 132 may be comprised of an organic material having an appropriate Tg according to the sizes of the substrate 110, the semiconductor chip structure 120, and the conductive frame 131. For example, the insulating filler 132 may include the same material as the underfill resin 22. In this case, unlike the example shown in FIGS. 15 and 16, the underfill resin 22 and the insulating filler 132 may be simultaneously formed.

As set forth above, according to example embodiments of the present inventive concept, by introducing a stiffener including (e.g., filled with) an organic material, it is possible to provide a semiconductor package with improved (e.g., reduced) warpage at room temperature and high temperature.

Herein, the terms "a lower side," "a lower portion," "a lower surface," and the like are used to refer to a first direction toward a mounting surface of the fan-out semiconductor package in relation to cross sections of the drawings, while the terms "an upper side," "an upper portion," "an upper surface," and the like are used to refer to an opposite, second direction to the first direction. However, these directions are defined for convenience of explanation, and the claims are not particularly limited by the directions defined as described above.

The meaning of a "connection" of a component to another component in the description includes an indirect connection (e.g., through an adhesive layer) as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not necessarily refer to the same example embodiment, and is provided to emphasize a particular feature or characteristic different from that of another example embodiment. However, example embodiments provided herein are considered to be able to be implemented by being combined in whole or in part with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package comprising:

a substrate including a wiring;

a semiconductor chip structure on the substrate, and electrically connected to the wiring;

an underfill resin in a space between the substrate and the semiconductor chip structure; and a stiffener surrounding a side surface of the semiconductor chip structure, on the substrate, wherein the stiffener includes a conductive frame having a cavity therein and an insulating filler in the cavity, wherein a portion of the conductive frame is between the side surface of the semiconductor chip structure and the insulating filler, wherein the insulating filler does not contact a lower surface of the conductive frame facing the substrate, and wherein, on a plane, the cavity of the conductive frame has an elongated shape in one direction, and is filled with only the insulating filler in the one direction.

2. The semiconductor package of claim 1, wherein the insulating filler includes the same organic material as the underfill resin, and wherein the stiffener is spaced apart from the underfill resin.

3. The semiconductor package of claim 1, wherein a minimum width of the semiconductor chip structure is 20 millimeters (mm) or more, and wherein a minimum width of the substrate is 40 mm or more.

4. The semiconductor package of claim 1, wherein the stiffener contacts 30% or more of a surface area of an upper surface of the substrate, and wherein the insulating filler contacts the conductive frame.

5. The semiconductor package of claim 1, wherein at least a portion of the insulating filler is free of having the conductive frame thereon.

6. The semiconductor package of claim 1, wherein the cavity has a vertical cross-sectional shape that extends from an upper surface of the conductive frame to a lower surface of the conductive frame.

7. The semiconductor package of claim 1, wherein the conductive frame is on a side surface and a bottom surface of the insulating filler in the cavity, such that the insulating filler does not contact the substrate.

8. The semiconductor package of claim 1, wherein the insulating filler in the cavity comprises a first rectangular shape among a plurality of rectangular shapes that are spaced apart from each other in the conductive frame.

9. The semiconductor package of claim 1, wherein the conductive frame has a plurality of edge portions respectively corresponding to edges of the semiconductor chip structure and a plurality of corner portions connecting the plurality of edge portions, and wherein the insulating filler is in at least one of the plurality of edge portions and at least one of the plurality of corner portions.

10. The semiconductor package of claim 1, further comprising a heat sink on the semiconductor chip structure and the stiffener.

11. The semiconductor package of claim 1, wherein the semiconductor chip structure comprises a first semiconductor chip structure, and wherein the semiconductor package further comprises a second semiconductor chip structure that is spaced apart from the first semiconductor chip structure in a first direction that is parallel to an upper surface of the substrate.

12. The semiconductor package of claim 11, wherein the second semiconductor chip structure comprises a plurality of semiconductor chips stacked in a second direction that is perpendicular to the upper surface of the substrate.

13. The semiconductor package of claim 1, wherein an upper surface of the stiffener is coplanar with or lower than an upper surface of the semiconductor chip structure.

14. A semiconductor package comprising:

a substrate including a first wiring;

an interposer substrate on the substrate, and including a second wiring electrically connected to the first wiring;

a semiconductor chip structure on the interposer substrate, and including first and second semiconductor chip structures electrically connected to each other by the second wiring; and a stiffener surrounding a side surface of the interposer substrate and a side surface of the semiconductor chip structure, on the substrate, wherein the stiffener includes a conductive frame having an opening therein and an insulating filler in the opening, wherein a first side surface and a second side surface of the insulating filler contact the conductive frame, wherein the insulating filler is not inserted between the conductive frame and the substrate, wherein the conductive frame comprises a metal material, wherein the insulating filler comprises an organic material, and wherein, on a plane, the opening of the conductive frame has an elongated shape in one direction, and is filled with only the insulating filler in the one direction.

15. The semiconductor package of claim 14, further comprising an encapsulant on the interposer substrate, and on the first and second semiconductor chip structures.

16. The semiconductor package of claim 14, wherein the second semiconductor chip structure comprises a plurality of semiconductor chips stacked in a direction perpendicular to an upper surface of the interposer substrate, and wherein at least a portion of the plurality of semiconductor chips includes a through-via that electrically connects the plurality of semiconductor chips to each other.

17. The semiconductor package of claim 14, further comprising a heat sink on the first and second semiconductor chip structures and the stiffener.

18. The semiconductor package of claim 14, further comprising a plurality of passive components on the substrate and spaced apart from the stiffener and the interposer substrate, wherein the plurality of passive components are electrically connected to at least a portion of the first and second semiconductor chip structures through the first and second wirings.

19. A semiconductor package comprising:

a substrate;

a semiconductor chip structure on the substrate;

a conductive frame surrounding the semiconductor chip structure on the substrate, the conductive frame having a cavity elongated in one direction; and an insulating filler in an inside of the conductive frame, wherein the insulating filler comprises a material having a glass transition temperature (Tg), wherein the insulating filler contacts an inside wall of the conductive frame, and wherein the insulating filler does not contact a lower surface of the conductive frame facing the substrate, and wherein the cavity of the conductive frame is filled with only the insulating filler in the one direction.

20. The semiconductor package of claim 19, wherein the Tg of the insulating filler is 200° C. or lower.

* * * * *